(12) United States Patent
Lin et al.

(10) Patent No.: US 9,698,030 B2
(45) Date of Patent: *Jul. 4, 2017

(54) TEMPERATURE CONTROLLED LOADLOCK CHAMBER

(71) Applicant: Taiwan Semiconductor Manufacturing Company, Ltd., Hsin-Chu (TW)

(72) Inventors: Chun-Hsien Lin, Hsin-Chu (TW); Jyh-Cherng Sheu, Hsin-Chu (TW); Ming-Feng Yoo, Hsin Chu (TW); Kewei Zuo, Xinbei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/537,569

(22) Filed: Nov. 10, 2014

(65) Prior Publication Data

US 2015/0132100 A1     May 14, 2015

Related U.S. Application Data

(63) Continuation of application No. 11/769,589, filed on Jun. 27, 2007, now Pat. No. 8,905,124.

(51) Int. Cl.
*G05D 23/00* (2006.01)
*H01L 21/67* (2006.01)

(52) U.S. Cl.
CPC .. *H01L 21/67201* (2013.01); *H01L 21/67248* (2013.01)

(58) Field of Classification Search
CPC .................... H01L 21/67248; H01L 21/67201
USPC ......................................................... 165/287
See application file for complete search history.

(56) References Cited

U.S. PATENT DOCUMENTS

| | | | |
|---|---|---|---|
| 5,552,017 | A | 9/1996 | Jang et al. |
| 6,270,861 | B1 | 8/2001 | Mashburn |
| 6,374,907 | B1 | 4/2002 | Tousignant et al. |
| 6,413,321 | B1 | 7/2002 | Kim et al. |
| 6,479,801 | B1 * | 11/2002 | Shigeoka .............. G01J 5/0003 219/497 |
| 6,645,344 | B2 | 11/2003 | Caldwell et al. |
| 6,802,935 | B2 | 10/2004 | Cheng et al. |
| 6,920,915 | B1 | 7/2005 | Shih et al. |
| 6,986,261 | B2 | 1/2006 | Sasaki et al. |

(Continued)

*Primary Examiner* — Travis Ruby
(74) *Attorney, Agent, or Firm* — Slater Matsil, LLP

(57) ABSTRACT

A temperature controlled loadlock chamber for use in semiconductor processing is provided. The temperature controlled loadlock chamber may include one or more of an adjustable fluid pump, mass flow controller, one or more temperature sensors, and a controller. The adjustable fluid pump provides fluid having a predetermined temperature to a temperature-controlled plate. The mass flow controller provides gas flow into the chamber that may also aid in maintaining a desired temperature. Additionally, one or more temperature sensors may be combined with the adjustable fluid pump and/or the mass flow controller to provide feedback and to provide a greater control over the temperature. A controller may be added to control the adjustable fluid pump and the mass flow controller based upon temperature readings from the one or more temperature sensors.

20 Claims, 4 Drawing Sheets

(56) References Cited

U.S. PATENT DOCUMENTS

| | | |
|---|---|---|
| 2005/0016454 A1 | 1/2005 | Kurita et al. |
| 2005/0183823 A1* | 8/2005 | Yonekawa .......... G03F 7/70525 156/345.31 |
| 2006/0021568 A1* | 2/2006 | Matsumoto ........... C23C 16/455 118/62 |
| 2007/0006936 A1* | 1/2007 | Hosokawa ........ H01L 21/67201 141/8 |

* cited by examiner

US 9,698,030 B2

TEMPERATURE CONTROLLED LOADLOCK CHAMBER

RELATED APPLICATION

This application is a continuation of U.S. application Ser. No. 11/769,589, filed Jun. 27, 2007, entitled "TEMPERATURE CONTROLLED LOADLOCK CHAMBER", the entire disclosure of this application is hereby incorporated herein by reference.

BACKGROUND

As integrated circuit feature sizes decrease, the gate dielectric thickness of field effect transistors (FETs) also decreases. This decrease is driven in part by the demands of overall device scaling. As gate conductor widths decrease, for example, other device dimensions decrease to maintain the proper device scale, and thus device operation. Another factor driving gate dielectric thickness reduction is the increased transistor drain current realized from a reduced gate dielectric thickness. The transistor drain current is proportional to the amount of charge induced in the transistor channel region by the voltage applied to the gate conductor. The amount of charge induced by a given voltage drop across the dielectric is a factor of the capacitance of the gate dielectric.

In order to achieve increased capacitance, gate dielectrics made from oxides such as $SiO_x$ are now as thin as 10 Å. These extremely thin gate oxides result in increased gate-to-channel leakage current, however. Problems such as this have led to the use of materials that have dielectric constants that are greater than the dielectric constant of silicon oxide, which has a k value of about 3.9. Higher k values, for example 20 or more, may be obtained with various transition metal oxides, such as an oxynitride film. These high-k materials allow high capacitances to be achieved with relatively thick dielectric layers. In this manner, the reliability problems associated with very thin dielectric layers can be avoided while improving transistor performance.

There are, however, fabrication problems associated with forming gate dielectric layers that include high-k materials. Generally, semiconductor fabrication utilizes one or more cluster tools, which comprises various process chambers that can be utilized in association with a wafer handling system or device to perform a variety of semiconductor processes. These processes can include, for example, oxidation, nitridation, annealing, deposition processes, and the like.

In the example of forming a gate dielectric comprising an oxynitride film, a cluster tool may be used to perform an oxidation process, a nitridation process, and an anneal process, wherein each process is typically performed in different process chambers. Between chambers, a wafer is transferred through a loadlock chamber. The loadlock chamber typically has a non-adjustable cooling plate maintained at a specific temperature to cool the wafer. The oxidation chamber, however, fails to maintain a uniform temperature across the wafer. It has been found that this variation in the temperature across the wafer may result in a variation in the equivalent oxide thickness (EOT), which in turn results in a variation of the Idsat between FETs. This variation may be observed not only with FETs on different wafers, but also between FETs on different dies on a single wafer and between FETs on a single die. The variation in the Idsat may adversely affect the circuitry and reduce yield, thereby increasing costs.

Accordingly, there is a need for a method and a structure to maintain a more uniform temperature over a wafer during processing.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The operation and fabrication of the presently preferred embodiments are discussed in detail below. However, the embodiments and examples described herein are not the only applications or uses contemplated for the invention. The specific embodiments discussed are merely illustrative of specific ways to make and use the invention, and do not limit the scope of the invention or the appended claims.

Exemplary structures and methods are provided below for fabricating a metal oxide semiconductor field effect transistor (MOSFET) according to embodiments of the invention. Although the exemplary embodiments are described as a series of steps, it will be appreciated that this is for illustration and not for the purpose of limitation. For example, some steps may occur in a different order than illustrated yet remain within the scope of the invention. In addition, not all illustrated steps may be required to implement the present invention. Furthermore, the structures and methods according to embodiments of the invention may be implemented in association with the fabrication or processing of other semiconductor structures not illustrated.

Figure 1:
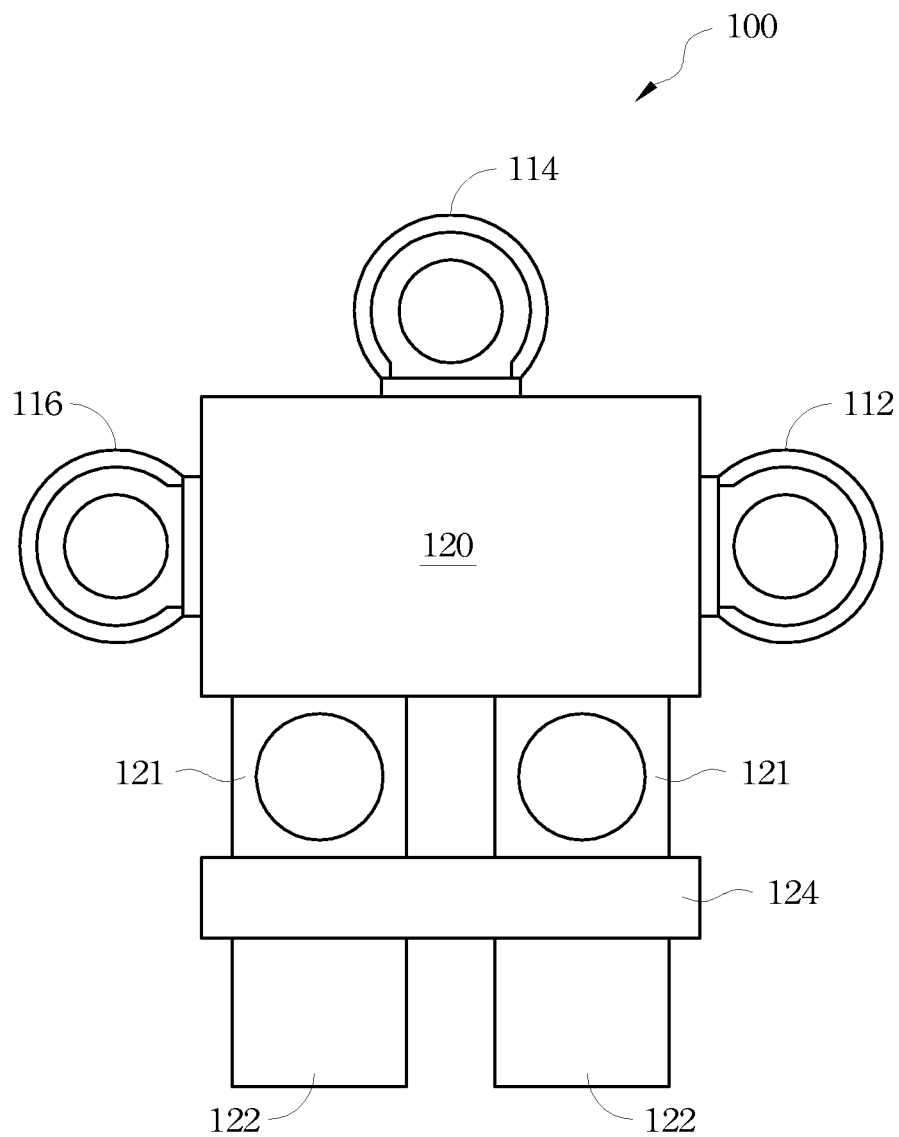
FIG. 1 is a schematic of a loadlock chamber in accordance with an embodiment of the present invention.

FIG. 1 schematically illustrates a cluster tool 100 in accordance with an embodiment of the present invention. The cluster tool 100 includes a first process chamber 112, a second process chamber 114, and a third process chamber 116 interconnected via a buffer chamber 120. In an embodiment, the first process chamber 112 is configured as an oxidation chamber, the second process chamber 114 is configured as a nitridation chamber, and the third process chamber 116 is configured as an annealing chamber, such as an RTA chamber, which preferably has an oxidizing ambient such as oxygen. Interconnected to the buffer chamber 120 are one or more loadlock chambers 121. The buffer chamber 120 and the one or more loadlock chambers 121 permit transferring one or more wafers between the first process chamber 112, the second process chamber 114, and the third process chamber 116 without breaking vacuum between processes or chambers.

The cluster tool 100 may optionally further include a front-opening unified pod (FOUP) docking system 122 and a factory interface 124. The FOUP docking system 122 and the factory interface 124 allow wafers to be loaded and unloaded without exposing the loadlock chambers 121, the buffer chamber 120, the first process chamber 112, the second process chamber 114, and the third process chamber 116 to air. The pressure of the FOUP docking system 122 is usually at about 1 atm (same as the fab environment), whereas that of a loadlock chamber 121 is much lower, typically under vacuum, e.g., less than about 10 Torr.

In operation, wafers are transferred into and out of the cluster tool 100, either individually or in batches, via the FOUP docking system 122. The wafers are transferred from the FOUP docking system 122 to the loadlock chamber 121 via the factory interface 124. Once transferred into the loadlock chambers 121, the wafers are isolated from the ambient environment. Typically, an inert gas such as nitrogen is purged through the loadlock chamber 121, which is pumped down to a low pressure, if not vacuum, typically ranging from 200 to 1000 Pa, to remove any air from the atmosphere. The wafers are transferred to one or more of the first process chamber 112, the second process chamber 114, and the third process chamber 116, which are also pumped down to a similar pressure to be in equilibrium with the pressure of the loadlock chambers 121, via the buffer chamber 120.

Processing may begin by one or more wafers being transferred from one or more of the loadlock chambers 121 into a processing chamber, e.g., the first process chamber 112, the second process chamber 114, and the third process chamber 116, using a belt, robotic arm, or other well-known transfer mechanism (not shown). Each of the processing chambers may be equipped with heating elements, gas flow orifices, radio frequency coils, and other equipment (not shown) necessary to affect the desired process.

In the illustrative embodiment, an oxide layer is deposited in the first process chamber 112. After formation of an oxide layer, the wafer is transferred from the first process chamber 112, via loadlock chambers 121, to the second process chamber 114. Thermal or plasma nitridation is performed in the second process chamber 114. Note that by utilizing cluster tool 100, vacuum need not be broken when transferring the wafer between processing chambers. This eliminates the possibility of the reactions of wafers with air or the moisture in the air. This also reduces the possibility of damage to the wafer from handling and the likelihood of contamination arising from exposure to the ambient environment. After nitridation, the wafer is transferred from the second process chamber 114, via the loadlock chambers 121, again without breaking vacuum, to the third process chamber 116 where the wafer is annealed.

It should be noted that FIG. 1 illustrates cluster tool 100 having three process chambers for illustrative purposes only. Other embodiments may include fewer or more process chambers. Additionally, other embodiments may utilize some, all, or none of the process chambers given above as examples. Embodiments of the present invention may be utilized, for example, in any cluster tool or other processing equipment wherein it is desirable to control the temperature of a wafer as it is being transported from a first location to a second location.

Figure 2:
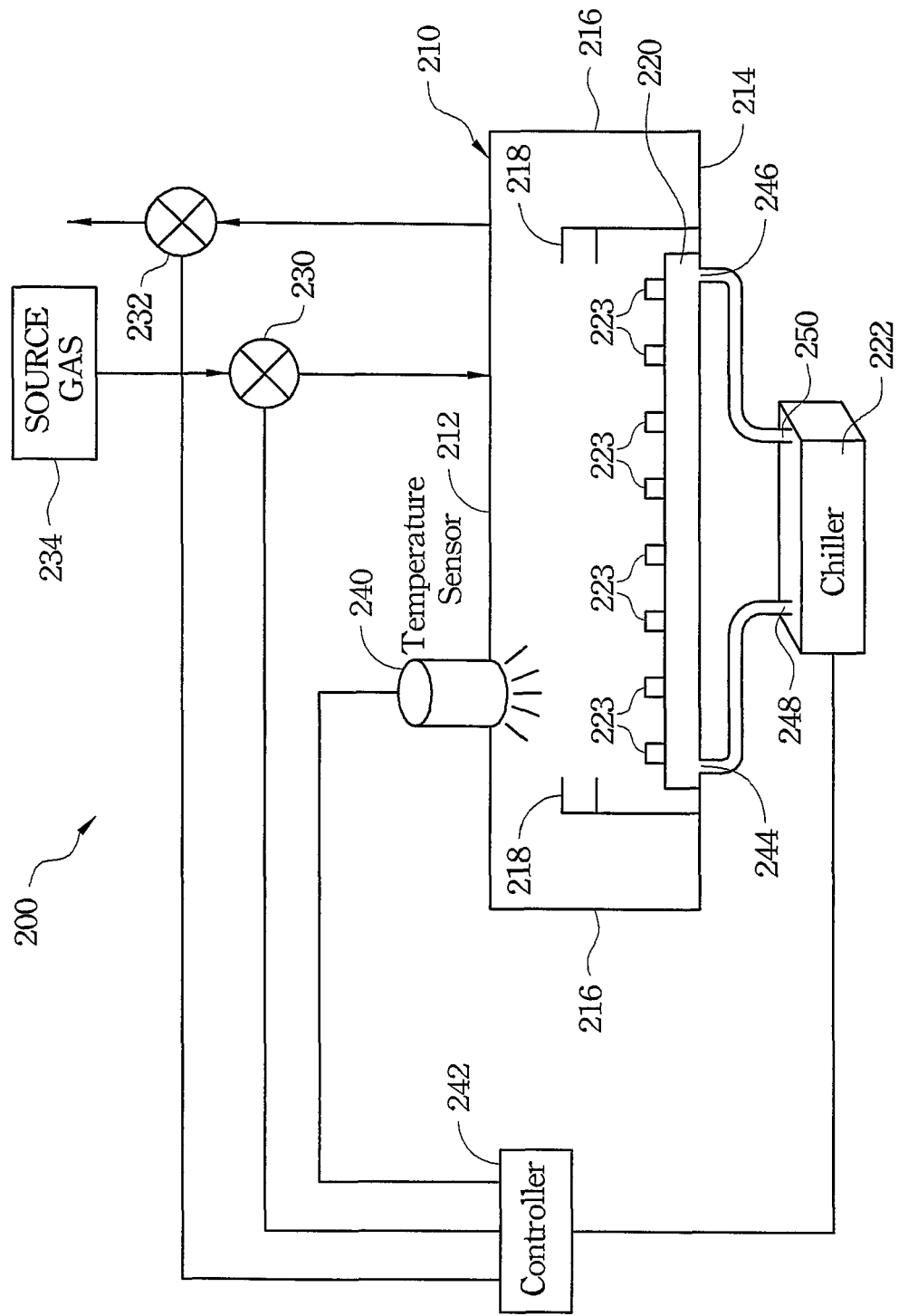
FIG. 2 is a block diagram of a loadlock chamber in accordance with an embodiment of the present invention.

FIG. 2 illustrates a cross section view of a loadlock chamber 200, which may be used as one or more of the loadlock chambers 121 of FIG. 1, in accordance with an embodiment of the present invention. One of ordinary skill in the art will realize that FIG. 2 schematically illustrates an embodiment of the present invention and an actual embodiment of the invention may take any shape or form.

Generally, the loadlock chamber 200 comprises an enclosed chamber 210 having a top 212, a bottom 214, and sidewalls 216. Holders 218 are positioned to hold one or more wafers during transport. A temperature-controlled plate 220 is positioned along the bottom 214 and is coupled to an adjustable chiller 222. The chiller 222 provides cooling water via a chiller output port 248 to the temperature-controlled plate 220 via a temperature-controlled plate input port 244, and the cooling water is returned from the temperature-controlled plate 220 via a temperature-controlled plate output port 246 to the chiller 222 via a chiller input port 250. In an embodiment, the chiller 222 is adjustable to supply a cooling liquid, such as water, having an adjustable temperature to the temperature-controlled plate 220. The chiller 222 may also be adjusted to provide the cooling liquid at an adjustable pressure. Generally, the temperature-controlled plate 220 includes tubing made of a material having good thermal conductivity properties. In an embodiment, copper tubing is used and the chiller 222 is adjustable to provide the cooling liquid having a temperature from about 17° C. to about 120° C., but more preferably from about 30° C. to about 90° C. Additionally, it is preferred that the chiller 222 and the temperature-controlled plate 220 are a pressurized system having a pressure ranging from about 1 atm to about 10 atm.

The temperature-controlled plate 220 may also include raised portions, such as a plurality of pins 223 upon which a wafer may rest. The height of the plurality of pins 223 may be adjusted to maximize the cooling effect, including the rate of cooling, needed for a particular application. For example, it has been found that the height of the pins may be reduced to shorten the period of time required to cool the wafer to a specific temperature. In an embodiment, the height of the plurality of pins 223 is between about 1 mm and about 0.1 mm. Other heights, however, may be used. It should also be noted that other shapes may be used. For example, the pins may be any shape and may comprise ridges or a spiral shape on the temperature-controlled plate 220.

FIG. 2 also illustrates a mass flow controller 230 and a control valve 232 in accordance with an embodiment of the present invention. The mass flow controller 230 and the control valve 232 act together to create and maintain a gas atmosphere within the loadlock chamber 200. In particular, the mass flow controller 230 is coupled to a source gas 234 to control the flow of gas into the loadlock chamber 200, and the control valve 232 is coupled to the loadlock chamber 200 to release gas from within the loadlock chamber 200 by pump. In an embodiment, the mass flow controller 230 and the control valve 232 cooperate to maintain a specific pressure within the loadlock chamber 200. Preferably, the mass flow controller 230 and the control valve 232 are configured to maintain an atmospheric pressure within the loadlock chamber 200 from about 3 Torr to about 760 Torr.

In a preferred embodiment, the loadlock chamber 200 includes a temperature sensor 240, such as an infra-red temperature sensor, communicatively coupled to a controller 242, which may also be communicatively coupled to the chiller 222, the mass flow controller 230, and/or the control valve 232. In this embodiment, the controller 242 receives temperature information from the temperature sensor 240 and automatically controls the chiller 222, the mass flow controller 230, and/or the control valve 232 to maintain a desired temperature. The desired temperature may be based upon, among other things, the previous process, the subsequent process, the wafer size and thickness, and the like.

Figure 4:
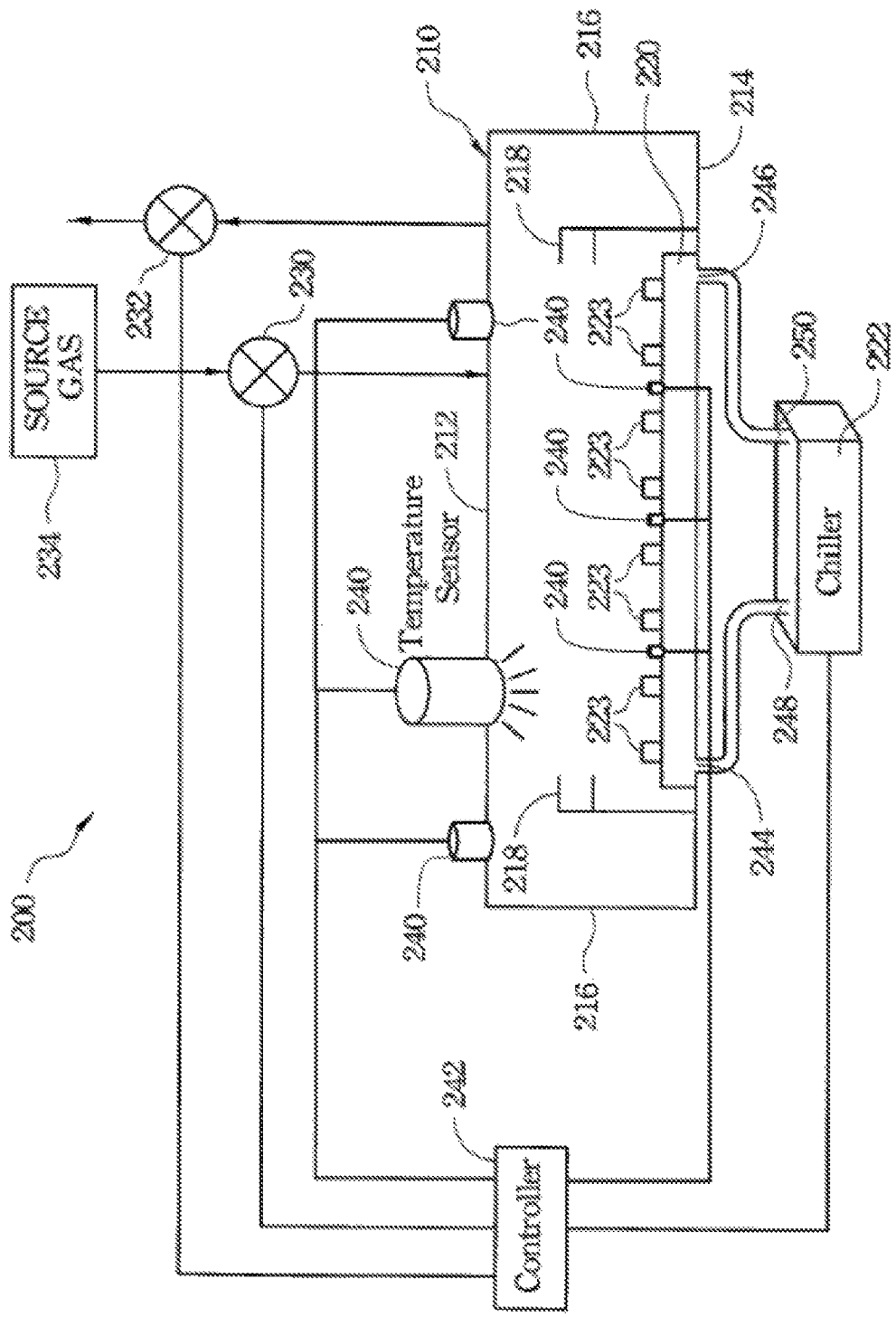
FIG. 4 is a block diagram of a loadlock chamber in accordance with an embodiment of the present invention.

It should also be noted that FIG. 2 illustrates a single temperature sensor 240 for illustrative purposes only. It may be desirable in some embodiments of the present invention to utilize multiple temperature sensors, and possibly different types of temperature sensors. For example, multiple temperature sensors may be positioned in various locations within the loadlock chamber 200 to provide temperature measurements in various regions of the wafer. The locations may include, for example, various locations across the wafer as well as both sides of the wafer. FIG. 4 illustrates an embodiment of the present invention comprising the multiple temperature sensors positioned in various locations within the loadlock chamber 200.

Figure 3:
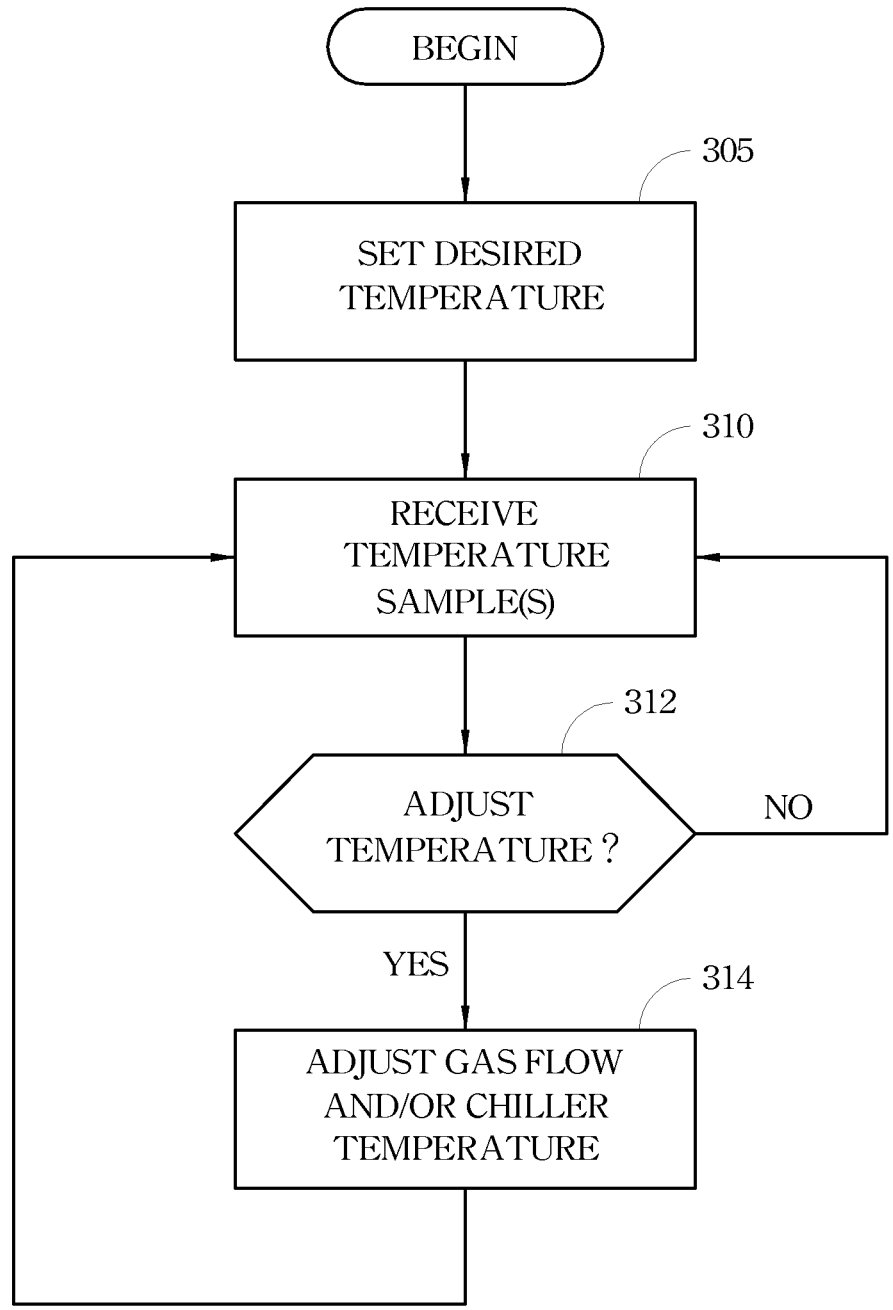
FIG. 3 is a flow chart illustrating a process of controlling the temperature of a wafer in a loadlock chamber in accordance with an embodiment of the present invention.

FIG. 3 is a flow diagram illustrating a procedure that may be performed to control the temperature of a wafer in accordance with an embodiment of the present invention. The process begins in step 305, wherein a desired temperature is set. The desired temperature may be set by a user, read from a database, or the like. It should be noted that the desired temperature may be based upon the process or processes being performed on the wafer. For example, the desired temperature may be set to a first temperature immediately after a first process has been performed to cause the temperature of the wafer to decrease slowly or quickly, or to cause the temperature of the wafer to increase slowly or quickly. A second process may require different temperatures. As another example, it may be desirable to maintain a specific wafer temperature prior to performing a specific process.

The process then proceeds to step 310, wherein one or more temperature samples are received. The temperature samples may be received from a single temperature sensor or from multiple temperature sensors placed in different locations within the loadlock chamber 200. For example, temperature sensors may be placed across the top surface 212 of the loadlock chamber 200 spaced apart such that the temperature sensors measure different portions of the wafer, including around the perimeter and the interior of the wafer. Additional temperature sensors may be placed to measure the temperature along the bottom of the wafer. FIG. 4 illustrates an embodiment of the present invention comprising additional temperature sensors placed to measure the temperature along the bottom of the wafer.

In step 312, a determination is made whether or not the temperature needs adjusting. The desired temperature (see step 305) is compared to the temperature samples and an adjustment, if necessary, is determined. If a determination is made that an adjustment is necessary, then processing proceeds to step 314, wherein an adjustment is made. The adjustment may include, for example, increasing the gas flow and pressure via the mass flow controller 230, reducing the gas flow and pressure via the mass flow controller 230 and the control valve 232, adjusting the temperature of the cooling fluid supplied by the chiller 222, adjusting the flow rate of the cooling fluid supplied by the chiller 222, and/or the like.

If in step 312 a determination is made that an adjustment is not necessary, then processing returns to step 310, wherein new temperature samples are received for processing.

It should be noted that the embodiment of the present invention discussed above assumes that the loadlock chamber 200 be equipped with both an adjustable chiller and a mass flow controller for providing temperature adjustment by fluid and gas, respectively. Embodiments of the present invention, however, may utilize one or more of these features. For example, an embodiment of the present invention may utilize an adjustable chiller, another embodiment of the present invention may utilize an adjustable chiller with a temperature sensor, another embodiment of the present invention may utilize a mass flow controller to maintain a specific temperature, another embodiment of the present invention may utilize a mass flow controller with a temperature sensor, and another embodiment may utilize an adjustable chiller, a mass flow controller, and a temperature sensor.

One of ordinary skill in the art will realize that the temperature controlled loadlock chamber disclosed herein provides dynamic controls and a feedback loop for maintaining optimum temperatures for a specific process. In this manner, more uniform semiconductor devices, including more uniform gate dielectrics, may be created. The increased uniformity will enable more accurate and uniform circuits to be created.

An embodiment of the invention provides a loadlock chamber for semiconductor processing. The loadlock includes a chamber, a temperature-controlled plate within the chamber and a chiller. The temperature-controlled plate has a first intake port and a first output port interconnected by tubing. The chiller has a second output port coupled to the first intake port and a second intake port coupled to the first output port. The chiller has an adjustable temperature for which the chiller may provide cooling fluid to the temperature-controlled plate via the second output port and the first intake port.

In another embodiment of the present invention, another loadlock chamber for semiconductor processing is provided. The loadlock chamber includes a chamber, a temperature-controlled plate within the chamber, an adjustable chiller, and a mass flow controller. The adjustable chiller is coupled to the temperature-controlled plate. The mass flow controller is coupled to a gas intake port in the chamber and allows a flow of gas into the chamber.

In another embodiment of the present invention, another loadlock chamber for semiconductor processing is provided. The loadlock chamber includes a chamber, a mass flow controller, a cooling plate, an adjustable chiller, one or more temperature sensors, and a controller. The cooling plate is located in an interior region of the chamber and is coupled to the chiller to allow the chiller to flow fluid at an adjustable temperature through the cooling plate. The controller is communicatively coupled to the one or more temperature sensors, the adjustable chiller, and the mass flow controller. The controller receives temperature readings from the one or more temperature sensors and adjusts one or both of the flow of gas through the mass flow controller and a temperature of the fluid flowing through the adjustable chiller.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
placing a substrate in a loadlock chamber;
setting a temperature of an environment within the loadlock chamber to a desired temperature, the setting the temperature of the environment comprising setting a gas flow rate of a gas into the loadlock chamber to a first gas flow rate, setting a gas pressure of the gas to a first gas pressure, setting a liquid flow rate of a liquid flowing from a chiller and through the loadlock chamber to a first liquid flow rate, setting a liquid temperature of the liquid flowing from the chiller and through the loadlock chamber to a first liquid temperature, and a combination thereof;
generating a temperature sample from a temperature sensor disposed in the loadlock chamber, the temperature sample being generated from a temperature of the substrate in the loadlock chamber;
based on the temperature sample and the desired temperature of the environment, determining whether to adjust the temperature of the environment;
if determined to adjust the temperature of the environment, based on the temperature sample, using a controller to adjust at least one of the gas flow rate to a second gas flow rate and the gas pressure to a second gas pressure and to adjust at least one of the liquid flow rate to a second liquid flow rate and the liquid temperature to a second liquid temperature; and
transferring the substrate from the loadlock chamber to a processing chamber.

2. The method of claim 1, wherein the environment within the loadlock chamber consists essentially of an inert gas.

3. The method of claim 1, wherein the using the controller to adjust the temperature of the environment within the loadlock chamber comprises the adjusting the liquid flow rate of the liquid, the liquid flowing from the chiller and through tubing in a plate disposed in the loadlock chamber, the substrate being placed on the plate.

4. The method of claim 3, wherein the plate has pins extending away from a surface of the plate, the substrate being placed on the pins.

5. The method of claim 1, wherein the using the controller to adjust the temperature of the environment within the loadlock chamber comprises the adjusting the gas flow rate of the gas into the loadlock chamber using a mass flow controller coupled to a gas source to provide the gas from the gas source to the loadlock chamber.

6. The method of claim 1, wherein the using the controller to adjust the temperature of the environment within the loadlock chamber comprises the adjusting the gas pressure of the gas using a mass flow controller coupled to a gas source to supply gas to the loadlock chamber and using a control valve to release gas from the loadlock chamber.

7. The method of claim 1, wherein the temperature sensor is an infra-red temperature sensor.

8. A method comprising:
placing a wafer over a plate in a loadlock chamber;
monitoring a temperature of the wafer from a temperature sensor in the loadlock chamber, the temperature sensor located over the wafer;
determining whether to adjust the temperature of the wafer;
if determined to adjust the temperature of the wafer, using a controller to adjust an inert environment in the loadlock chamber while the wafer is in the loadlock chamber, the adjusting the inert environment based at least in part on the temperature of the wafer, the adjusting the inert environment comprising adjusting at least one of an inert gas flow rate to a desired gas flow rate and a pressure of the inert gas flowing into the inert environment to a desired gas pressure,
the adjusting the inert environment further comprising using the controller to adjust chilling liquid flowing from a chiller to the plate in the loadlock chamber based at least in part on the temperature of the wafer, the adjusting the chilling liquid comprising adjusting at least one of a chilling liquid flow rate to a desired liquid flow rate, a chilling liquid temperature to a desired liquid temperature, and a chilling liquid pressure to a desired liquid pressure; and
transferring the wafer from the loadlock chamber to a processing chamber.

9. The method of claim 8, wherein the monitoring the temperature of the wafer comprises generating a temperature sample of the wafer from the temperature sensor disposed in the loadlock chamber.

10. The method of claim 8, wherein the adjusting the inert environment in the loadlock chamber comprises adjusting the inert gas flow rate, the inert gas coming from a gas source into the loadlock chamber.

11. The method of claim 8, wherein the adjusting the inert environment in the loadlock chamber comprises adjusting a pressure of the inert environment.

12. The method of claim 8, wherein the adjusting the chilling fluid liquid comprises adjusting the chilling liquid flow rate, the chilling liquid flowing through the plate on which the wafer is placed in the loadlock chamber.

13. The method of claim 8, wherein the adjusting the chilling liquid comprises adjusting the chilling liquid temperature, the chilling liquid flowing through the plate.

14. A method comprising:
loading a wafer onto a plate in a loadlock chamber, the plate being affixed to a bottom wall of the loadlock chamber;
purging the loadlock chamber with an inert gas while the wafer is in the loadlock chamber, the purging creating an inert environment in the loadlock chamber;
taking a temperature sample from a plurality of temperature sensors disposed in the loadlock chamber, the plurality of temperature sensors disposed above and below the wafer, the temperature sample being representative of a temperature of the wafer on the plate;
controlling a temperature of the inert environment with a controller while the wafer is in the loadlock chamber by adjusting a mass flow controller and a chiller, the controller configured to receive the temperature sample and to adjust both the mass flow controller and the chiller based upon the temperature sample; and
transferring the wafer from the loadlock chamber to a processing chamber.

15. The method of claim 14, wherein the plate comprises pins extending from a surface of the plate, the wafer being loaded onto the pins.

16. The method of claim 14 further comprising, before the taking the temperature sample, setting a parameter that contributes to the temperature of the inert environment.

17. The method of claim 14, wherein the adjusting the mass flow controller comprises adjusting a flow rate of a gas into the inert environment.

18. The method of claim 14, wherein the adjusting the mass flow controller comprises adjusting a pressure of the inert environment.

19. The method of claim 14, wherein the adjusting the chiller comprises adjusting a temperature of chilling liquid flowing through the plate.

20. The method of claim 14, wherein the adjusting the chiller comprises adjusting a chilling liquid flow rate, the chilling liquid flowing through the plate.

* * * * *